United States Patent
Volk

(10) Patent No.: US 6,392,573 B1
(45) Date of Patent: May 21, 2002

(54) METHOD AND APPARATUS FOR REDUCED GLITCH ENERGY IN DIGITAL-TO-ANALOG CONVERTER

(75) Inventor: Andrew M. Volk, Loomis, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/001,716

(22) Filed: Dec. 31, 1997

(51) Int. Cl.$^7$ ................................................ H03M 1/06
(52) U.S. Cl. ........................................ 341/118; 341/144
(58) Field of Search ................................ 341/136, 133, 341/144; 330/253; 327/416

(56) References Cited

U.S. PATENT DOCUMENTS

| | | | | |
|---|---|---|---|---|
| 3,825,772 A | * | 7/1974 | Ainsworth | 307/247 |
| 3,921,011 A | * | 11/1975 | Orgill | 307/251 |
| 4,291,240 A | * | 9/1981 | Rosler | 307/262 |
| 4,461,964 A | * | 7/1984 | Shiotari | 307/362 |
| 4,980,583 A | * | 12/1990 | Dietz | 307/475 |
| 5,124,568 A | * | 6/1992 | Chen et al. | 307/243 |
| 5,148,165 A | * | 9/1992 | Phillips | 341/136 |
| 5,272,389 A | * | 12/1993 | Hatada | 307/264 |
| 5,859,571 A | * | 1/1999 | Lee et al. | 331/53 |
| 5,909,187 A | * | 6/1999 | Ahuja | 341/136 |

* cited by examiner

*Primary Examiner*—Peguy JeanPierre
(74) *Attorney, Agent, or Firm*—Blakely, Sokoloff, Taylor & Zafman LLP

(57) ABSTRACT

A current mode digital to analog converter (DAC) that can provide an output signal having reduced glitch energy over a wide range of manufacturing tolerances and operating conditions includes a cross-over voltage controller with feedback, disposed between the current switch and the input data source. In a further aspect of the present invention, circuitry operable to generate a synchronized differential pair of digital signals as input to the cross-over voltage controller is included. In a still further aspect of the present invention, load matching circuitry is coupled to the cross-over voltage controller output terminals to reduce timing differences between various stages of the DAC.

18 Claims, 11 Drawing Sheets

METHOD AND APPARATUS FOR REDUCED GLITCH ENERGY IN DIGITAL-TO-ANALOG CONVERTER

BACKGROUND OF THE INVENTION

1. Field of the Invention

The present invention relates generally to digital-to-analog converters (DAC) and more particularly to reducing the glitch energy at DAC outputs.

2. Background

Glitch energy is one measure of the output signal quality of a DAC. Glitch energy represents the difference in the amount of energy delivered to the output during a step in output level as compared to an ideal output step. Non-ideal DAC output transitions can result in signal distortions such as the output initially moving in a direction opposite that of the desired step, overshooting the step, or ringing after the step. The effect of these non-ideal transitions depends on the application of the DAC. In DACs used for driving graphics and video display devices, excessive glitch energy can cause color shifts at the borders of objects causing sparkles on the display screen.

DACs of the type commonly used for driving video and graphics display devices are called current mode DACs. Current mode DACs are made up of many current sources (e.g., 255 in an 8-bit linearly weighted DAC), each current source representing one or more least significant bits (LSB) of the DAC output. The currents are steered to either the output or to another node, typically ground, depending on the digital input code presented to the DAC for conversion. is that controlled by the LSB of the digital input code. This type of system requires N switches for an N-bit code, which is the fewest possible in this type of design. However, it is difficult to make all the sources and switches sufficiently matched that good DAC linearity is maintained for code transitions between $(2^M-1)$ and $(2^M)$ for large M.

A least significant bit defines the smallest current source and switch size. As the amount of current is increased in the binary section of the DAC, the size of the transistors (or the number of elements in parallel) is increased proportionally.

In a linear system, data input codes, specifying non-zero currents, are decoded so as to enable one or more equal valued current sources. As the code increases, a new unit of current is added to the total (see Table 1 below). If the system is entirely linear, each unit of current is an LSB and therefore $2^N-1$ switches are required for an N-bit digital input code (no switch for digital input code 0). Because all switches are substantially identical, linearity is easier to achieve than in a fully binarily weighted DAC. Unfortunately, a fully linearly weighted DAC requires a large amount of chip area and is therefore relatively expensive to implement.

To convert a digital input code to the control signals needed to drive the large number of current switches required by a linearly weighted DAC, a translation, referred to as a thermometer code is used. A thermometer decoder refers to an information processing network that takes an N bit input and produces a $2^N$ bit output as shown in Table 1 below.

TABLE 1

Four-bit Thermometer code example

| Binary Input | Current Switch (1 = to OUT, 0 = to Gnd) | | | | | | | | | | | | | | | |
|---|---|---|---|---|---|---|---|---|---|---|---|---|---|---|---|---|
| Data | 1 | 2 | 3 | 4 | 5 | 6 | 7 | 8 | 9 | 10 | 11 | 12 | 13 | 14 | 15 | 16 |
| 0000 | 0 | 0 | 0 | 0 | 0 | 0 | 0 | 0 | 0 | 0 | 0 | 0 | 0 | 0 | 0 | 0 |
| 0001 | 1 | 0 | 0 | 0 | 0 | 0 | 0 | 0 | 0 | 0 | 0 | 0 | 0 | 0 | 0 | 0 |
| 0010 | 1 | 1 | 0 | 0 | 0 | 0 | 0 | 0 | 0 | 0 | 0 | 0 | 0 | 0 | 0 | 0 |
| 0011 | 1 | 1 | 1 | 0 | 0 | 0 | 0 | 0 | 0 | 0 | 0 | 0 | 0 | 0 | 0 | 0 |
| 0100 | 1 | 1 | 1 | 1 | 0 | 0 | 0 | 0 | 0 | 0 | 0 | 0 | 0 | 0 | 0 | 0 |
| 0101 | 1 | 1 | 1 | 1 | 1 | 0 | 0 | 0 | 0 | 0 | 0 | 0 | 0 | 0 | 0 | 0 |
| . | | | | | | | | | | | | | | | | |
| . | | | | | | | | | | | | | | | | |
| . | | | | | | | | | | | | | | | | |
| 1101 | 1 | 1 | 1 | 1 | 1 | 1 | 1 | 1 | 1 | 1 | 1 | 1 | 1 | 1 | 0 | 0 |
| 1110 | 1 | 1 | 1 | 1 | 1 | 1 | 1 | 1 | 1 | 1 | 1 | 1 | 1 | 1 | 1 | 0 |
| 1111 | 1 | 1 | 1 | 1 | 1 | 1 | 1 | 1 | 1 | 1 | 1 | 1 | 1 | 1 | 1 | 1 |

As shown in FIG. 1, the currents are summed and then converted to an output voltage by a resistor ($R_{LOAD}$) connected from the output pad to ground.

The digital input code presented to the DAC typically controls the amount of current routed to the output in two ways. First, binarily weighted, and second linearly weighted. In a binary system, each bit of the digital input code controls an amount of current that corresponds to the significance of that bit in the digital input code. That is, bit 0 (the LSB) of the digital input code, switches $2^0$, i.e., one unit of current, bit 1 switches $2^1$, i.e., 2 units of current, and bit n switches $2^n$ units of current. These units of current are often referred to as an LSB of current because the smallest unit of current Many DAC designs use a combination of both binary and linear switch control. The DAC digital input code is "segmented" between binary and linear switch control. Binary is used for the least significant segment and linear for the most significant segment. Binary switch control is area efficient but tends to generate non-ideal output transitions because of the difficulty of balancing currents in differently sized switches. Linear switch control consumes more chip area but introduces fewer non-idealities into the output signal. The segmented DAC architecture provides a tradeoff between chip area and output signal quality. Examples of segmentation of an 8-bit DAC are given in Table 2 below.

TABLE 2

DAC segmentation examples

| Segmentation | Binary Switch Weights (LSBs) | Linear Switches | Linear Switch Weight (LSBs) | Total Switches Required |
|---|---|---|---|---|
| 2-6 | 1, 2 | 63 | 4 | 65 |
| 3-5 | 1, 2, 4 | 31 | 8 | 34 |
| 4-4 | 1, 2, 4, 8 | 15 | 16 | 19 |
| 5-3 | 1, 2, 4, 8, 16 | 7 | 32 | 12 |

The ideal transition of a DAC output when the input switches from code to code is a simple step with some reasonable rise time shorter than the smallest code duration. The actual transition may be significantly different. The difference from ideal in the energy transferred is the glitch energy.

The largest source of glitches is the timing skew between turning off one set of current switches while turning on a different set. This is usually due to the hazard in a binary encoding, for instance switching from code 00001111 to code 00010000. The code can briefly go to 00000000 or 00011111 causing overshoot or undershoot. Other causes of glitches are charge sharing in the switch (explained below) and capacitive feedthrough in the current switch from the switch driver. FIG. 2(a) shows an ideal step and FIG. 2(b) shows an example of a non-ideal transition.

FIG. 3 shows a block diagram of a conventional 8-bit DAC. This example uses 4—4 segmentation, i.e., 4 bits that are binarily decoded and 4 bits that are linearly decoded. The lower 4 bits and the decoded upper 4 bits are clocked into flip-flops to synchronize the output transitions between the bits. The flip-flops are connected to the switch drivers that control the current switches. The outputs of the current switches are summed and sent to the output pad.

FIG. 4 shows a conventional current switch control circuit along with other DAC circuit elements. The data input comes from the lower bits or from a thermometer decoder for the most significant bits. The data is clocked into a D-type flip-flop (DFF) 402 to synchronize the data to the clock. DFF 402 drives the current switch control signal generator that controls a pair of current steering transistors, PFET 410 and PFET 412. PFET 414 is the current source whose current magnitude is set by the bias signal ISET and the size of PFET 414. If the data clocked into DFF 402 is a zero, node 420 is low and node 422 is high. In this case PFET 412 is in a conducting state and PFET 410 is in a non-conducting state. All current is shunted to ground and no current (except current due to leakage or subthreshold conduction pathways) reaches the output pad from this current source of the DAC. Conversely, if DATA is high at the clock, then node 420 goes high, node 422 goes low, PFET 412 is turned off, and PFET 410 conducts the current to OUT. As shown in FIG. 4, the switch control signal generator outputs are applied respectively to node 420 and node 422. Ideally, the current switch control signal generator output signals, as applied to nodes 420, 422, should cross at a voltage such that as one of the current switch transistors turns off, the other turns on at a complementary rate so that the total current through both transistors remains constant. In an ideal switch, the voltage on a node 416 between the current source and current switches would not change during switching. Node 416 is referred to herein as the TAIL node.

The size of the transistors used in the current source and switches is proportional to the current they must source and switch in order that the current density is substantially equal in all sources and switches. This causes the operating points of each current source to be substantially equal to that of all the others, and the operating points of the switches to be substantially equal, thereby providing close matching. All the switches and current sources in the linear section of the DAC are respectively equal in size and respectively twice the size of the largest value in the binary section.

The switching waveforms for the conventional switch control circuit of FIG. 4, are shown in FIG. 5. The waveforms in FIG. 5 illustrate some of the difficulties with conventional switch control circuits. The crossover voltage of nodes 420 and 422 are difficult to control using only inverters. When the switch points are not equally delayed from the clock, output glitches may form from hazards during multiple bits changing in different directions.

The difficulty of balancing delays is made worse by the different loads resulting from the different switch sizes. This requires the switch drivers to be tuned for each binary step and for the linear section to give uniform delay and crossover voltage for all variations in process, temperature and voltage; a very difficult task.

Also, as shown in FIG. 5, if the switch drivers cross at too high or too low a voltage, then the current in both switch transistors is not constant and excess charge is taken from the TAIL node or is allowed to build up on the TAIL node. This is seen as a non-constant value on the TAIL node. The extent to which this deficit or excess of charge is transferred to OUT also increases the glitch energy.

Conventional circuit configurations that are used to balance delays and cross-over voltage in an attempt to improve control of current switches have been dependent on inverter, pass gate or logic gate delays. These circuit configurations suffer from dependencies of manufacturing tolerances and operating conditions.

What is needed is a DAC that can provide an output signal having reduced glitch energy over a wide range of manufacturing tolerances and operating conditions.

SUMMARY OF THE INVENTION

Briefly, a current mode DAC that can provide an output signal having reduced glitch energy over a wide range of manufacturing tolerances and operating conditions includes a cross-over voltage controller with feedback, disposed between the current switch and the input data source.

In a further aspect of the present invention, circuitry operable to generate a synchronized differential pair of digital signals as input to the cross-over voltage controller is included.

In a still further aspect of the present invention, load matching circuitry is coupled to the cross-over voltage controller to reduce timing differences between stages of the DAC.

Various other features and advantages of the present invention will be apparent from the accompanying drawings and from the detailed description that follows below.

DETAILED DESCRIPTION

Illustrative embodiments of the present invention are described below. In the interest of clarity, not all aspects of an actual implementation are described in this specification. It will of course be appreciated that in the development of any such actual embodiment, numerous implementation-specific decisions must be made to achieve the developer's specific goals, such as compliance with system-related, and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Terminology

Sparkle refers to the visually perceivable effect, in a display system, of non-ideal DAC output transitions.

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al) or an alloy of Al and copper (Cu), are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

Overview

The present invention includes feedback signal pathways in each digital to analog stage of a DAC to control the voltage crossover points of the current-switch control signal generator in that stage. An additional aspect of the present invention is the reduction of skew between the cross-over point in each of the several digital to analog stages that make up a DAC. Skew reduction is achieved by including circuitry to generate synchronized differential signals pairs to drive the cross-over voltage controllers in each D/A stage. Further skew reduction is achieved by load balancing. For example, by adding dummy transistors to the outputs of cross-over voltage controllers, better load matching between the several D/A stages of the DAC is achieved. This results in a reduction in the variance between the points in time, with respect to a reference clock, when the switch control signals of the several D/A stages cross. Those skilled in the art will recognize that other elements may be substituted for use in load balancing.

Circuit Configurations

Figure 1:
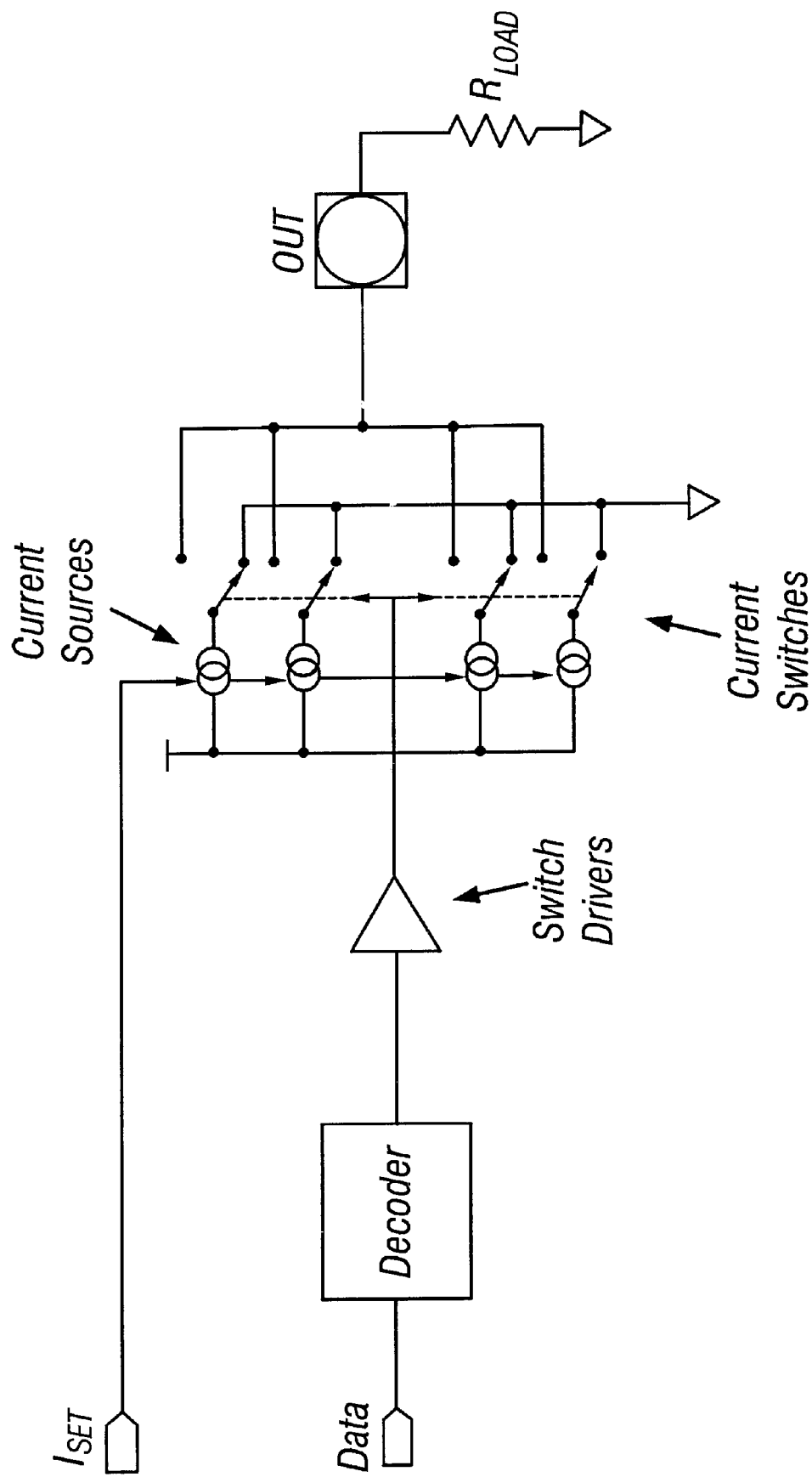
FIG. 1 is a block diagram of a basic DAC architecture.
Figure 2:
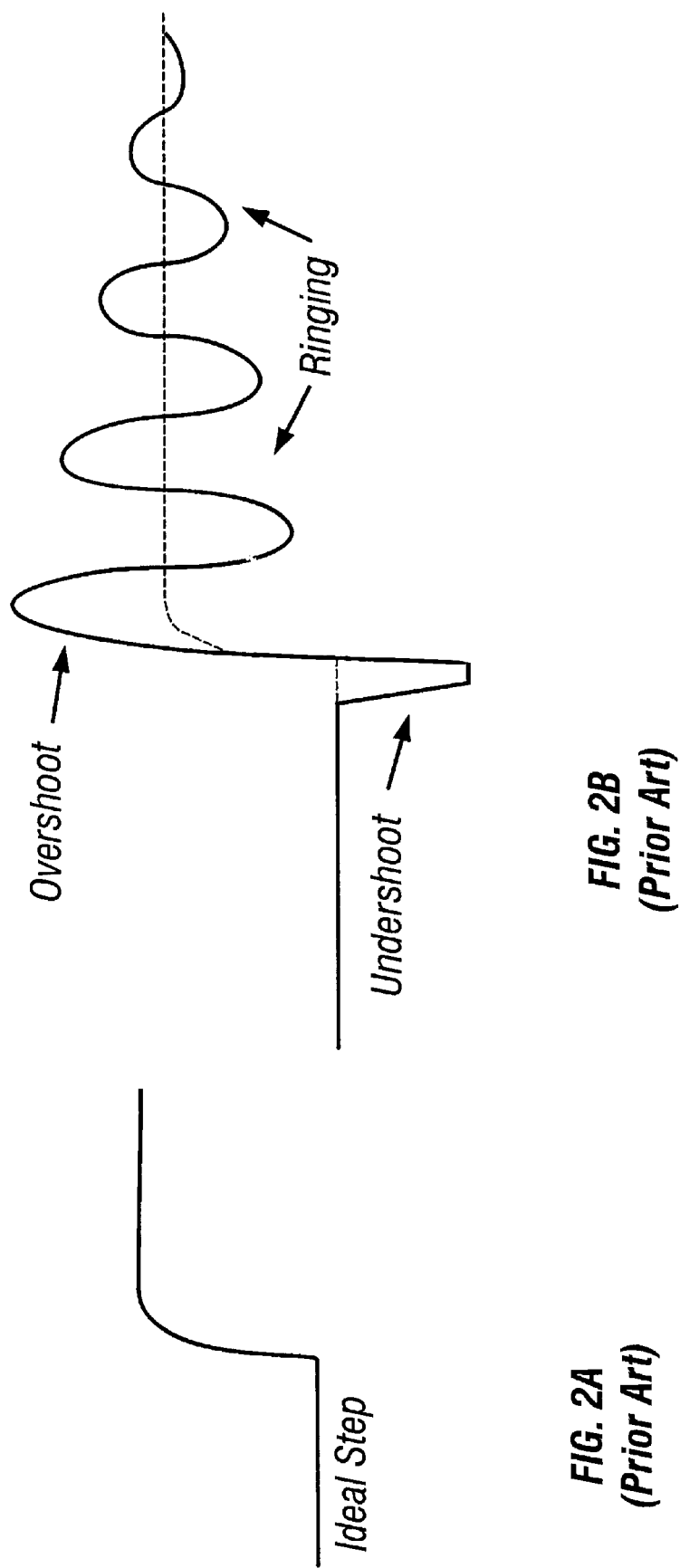
FIG. 2(a) shows a waveform of an ideal DAC output.
FIG. 2(b) shows a waveform of a typical DAC output.
Figure 3:
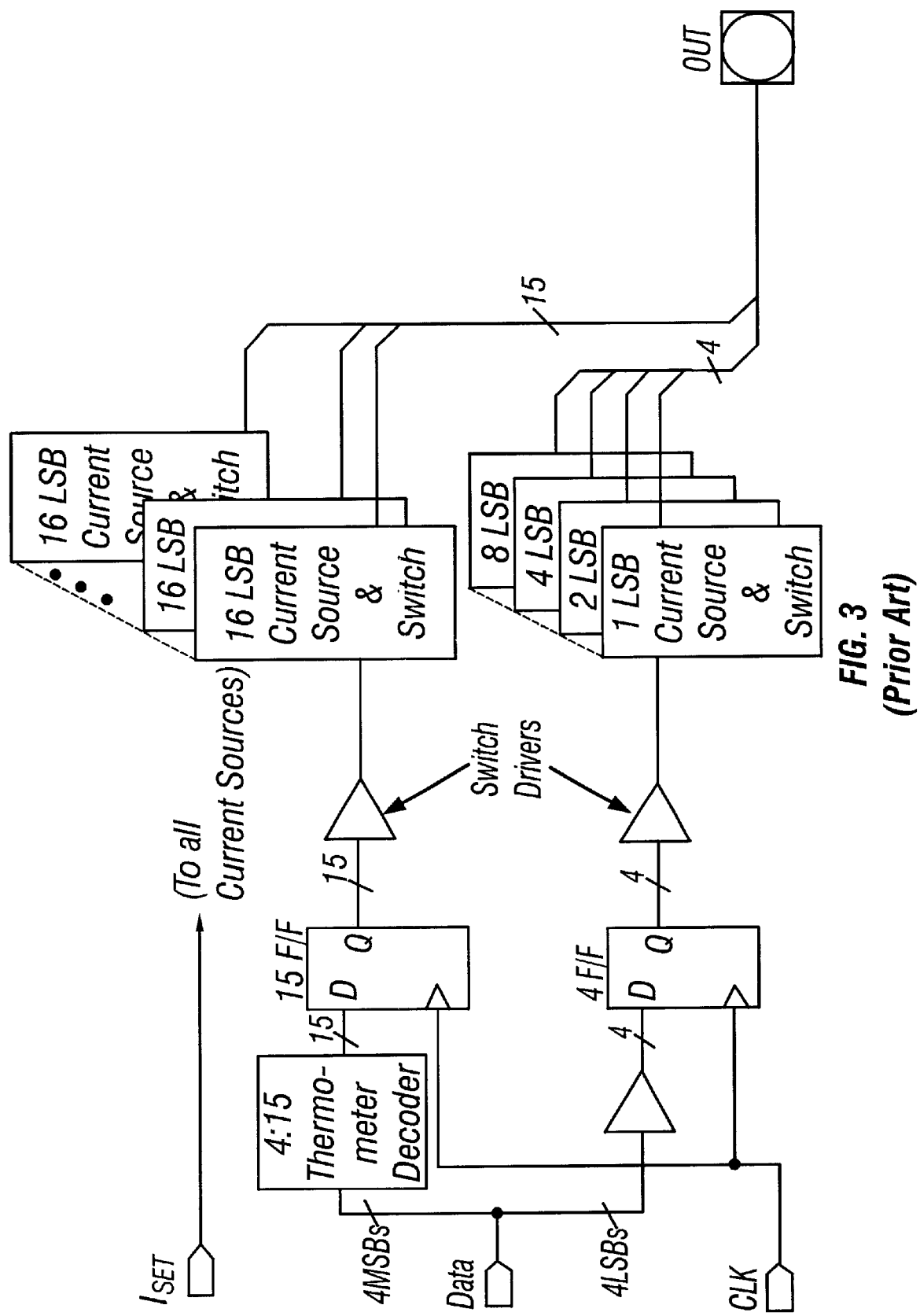
FIG. 3 is a block diagram of an 8-bit DAC with 4–4 segmentation.
Figure 4:
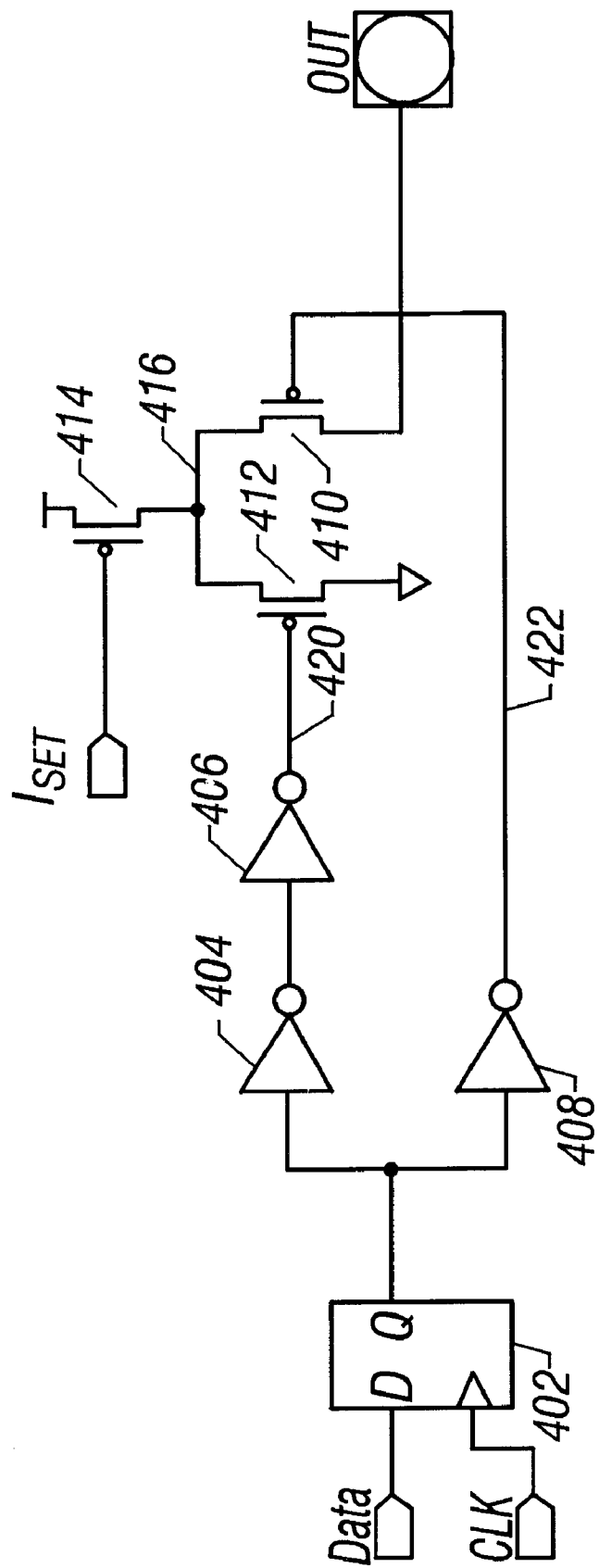
FIG. 4 is a schematic diagram of a DAC with typical switch controls.
Figure 5:
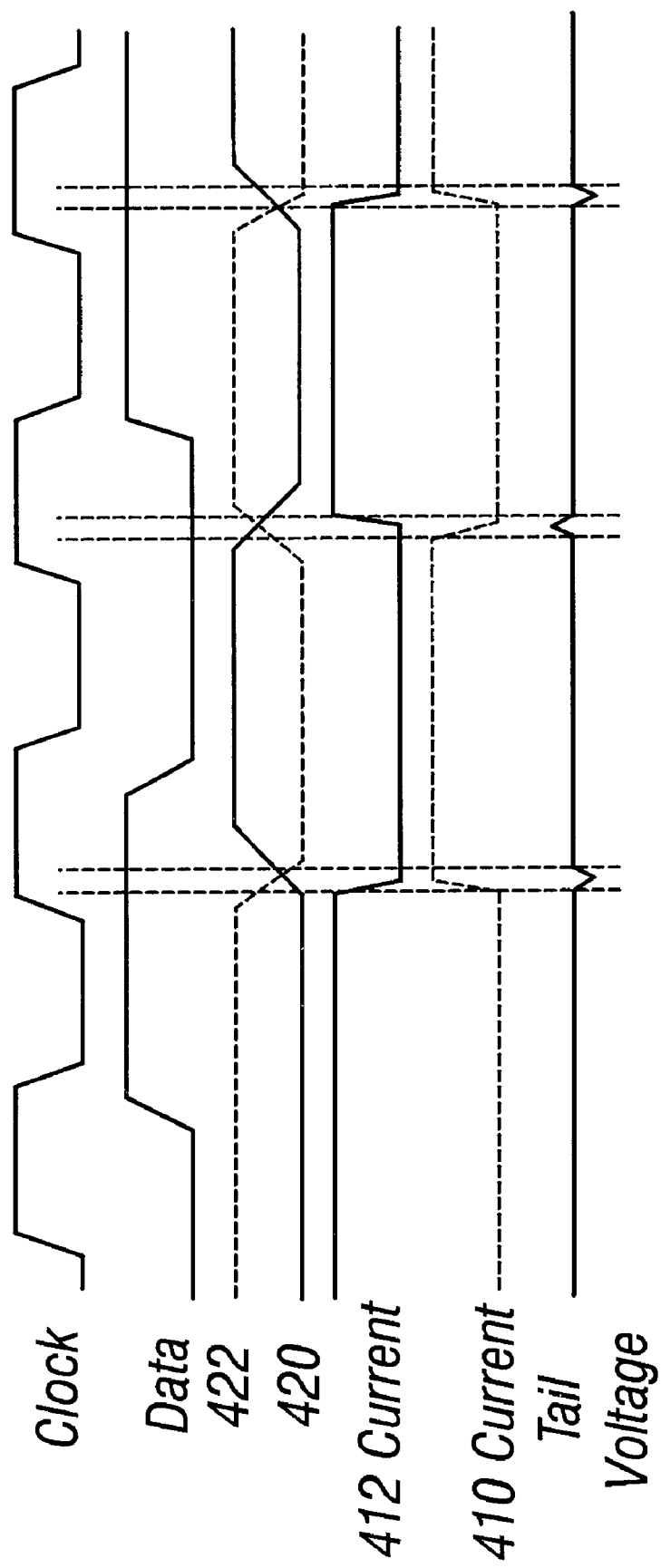
FIG. 5 shows typical switching waveforms.
Figure 6A:
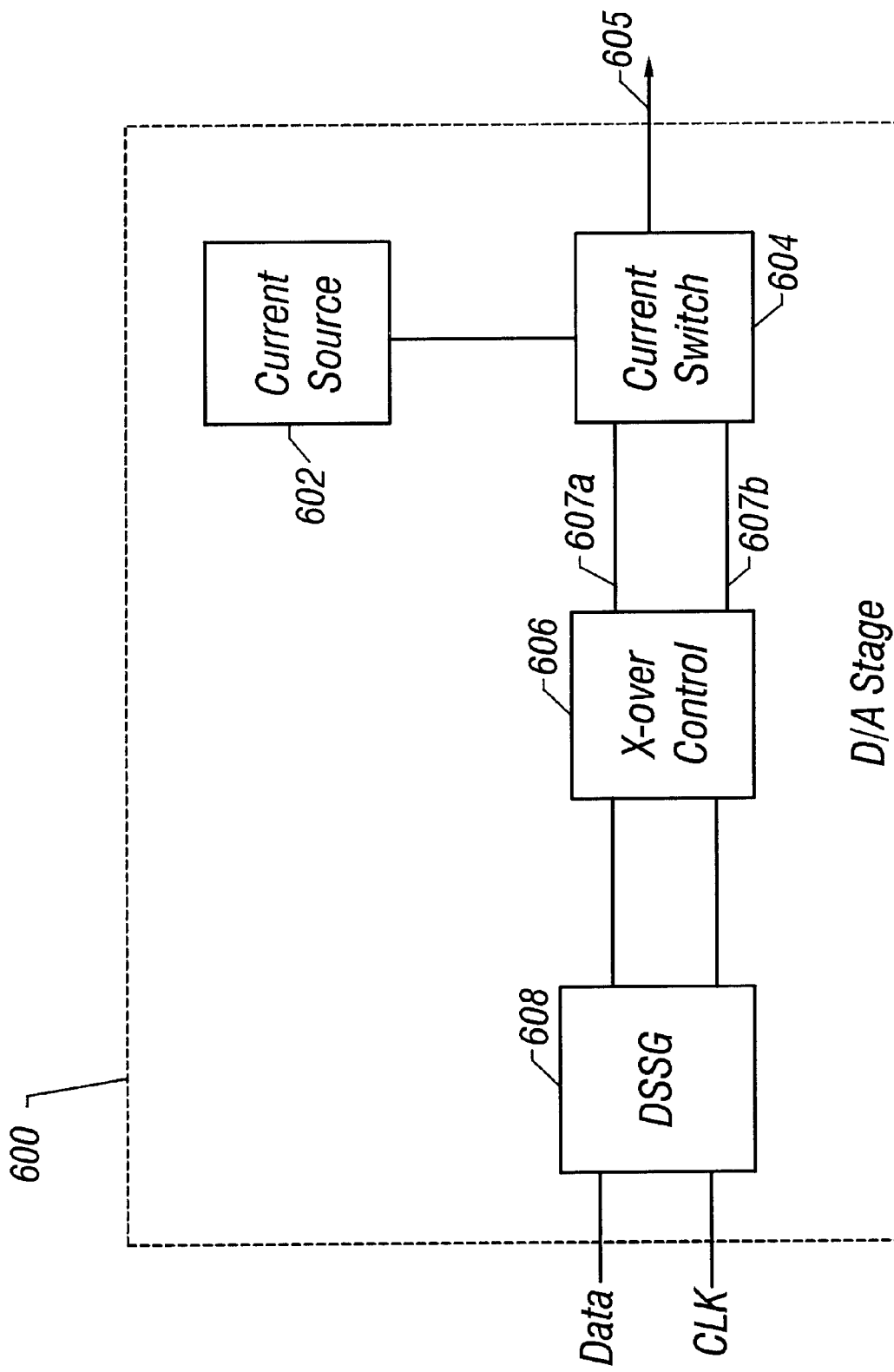
FIG. 6(a) is a block diagram of a digital to analog stage in accordance with the present invention.

Referring to FIG. 6(a), an illustrative embodiment of a D/A stage in accordance with the present invention is shown in block diagram form. A D/A stage 600 includes a current source 602 coupled to a current switch 604. Current switch 604 routes current from current source 602 to either an output node 605 or some other current sink, typically ground, as a function of the digital input data provided to stage 600. A cross-over voltage controller 606 is coupled to current switch 604. As shown in FIG. 6(a), cross-over voltage controller 606 provides switch control signals 607a and 607b to current switch 604. Switch control signals 607a and 607b control the routing of current between two current sinks. When D/A stage 600 is in a steady state condition, signals 607a and 607b are in opposite logical states. As described above, to achieve a smooth transition, the total current passing through current switch 604 should remain substantially constant. Cross-over controller 606 includes feedback signal paths such that the voltage levels of its output signals, i.e., switch control signals 607a and 607b are used to control the cross-over point of signals 607a and 607b. In a typical embodiment of the present invention, the cross-over point is lower than the mid-point voltage of control signals 607a, 607b sent by cross-over controller 606 to current switch 604.

In a typical embodiment of the present invention, the cross-over voltage is set to approximately one half of the gate drive needed for one current switch to pass the current from the current source. As used herein, gate drive refers to the amount voltage, over the FET threshold voltage, applied to a FET gate terminal (i.e., Vgs-Vt). The ideal cross-over voltage varies with the voltage at output node 605, however establishing the cross-over voltage as described above is sufficient to achieve a practical circuit with good performance. One embodiment of the present invention requires, at typical operating conditions, a gate drive of about 400 millivolts and therefore the cross-over voltage is set to about 200 millivolts.

Still referring to FIG. 6(a), a differential synchronized signal generator (DSSG) 608 is shown coupled to cross-over controller 606. DSSG 608 receives a data input which is typically one of the bits of the digital input code, and further receives a clock signal. DSSG 608 produces as an output, a logically complementary pair of signals synchronized to the clock signal.

Figure 6B:
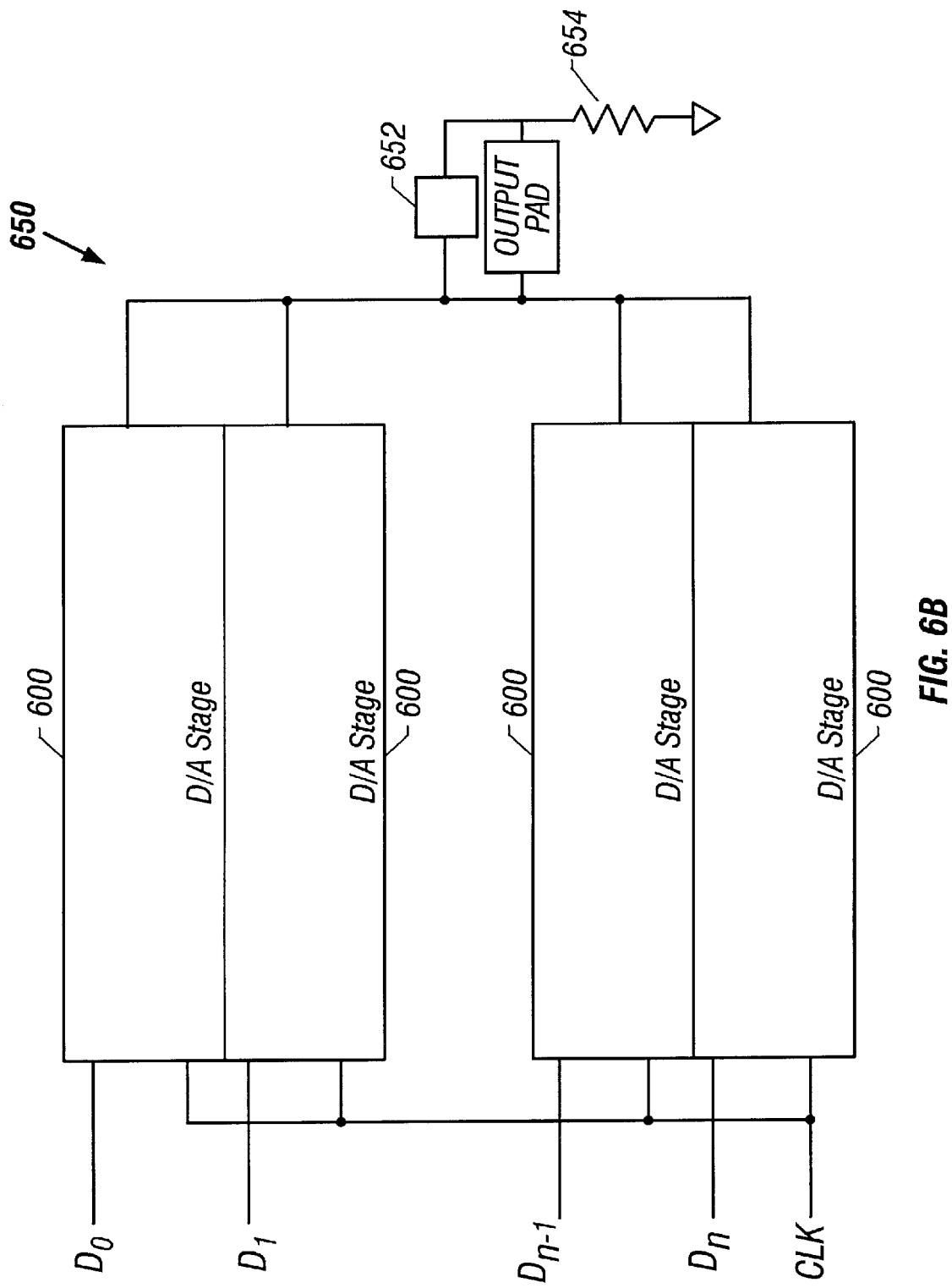
FIG. 6(b) is a block diagram of a digital to analog converter in accordance with the present invention.

Referring to FIG. 6(b), an illustrative embodiment of a DAC in accordance with the present invention is shown in block diagram form. A DAC 650 has several D/A stages 600, with the output of each D/A stage 600 coupled to a common node. Typically this common node is an output pad 652 with an external resistor 654 coupled between pad 652 and ground.

Figure 7:
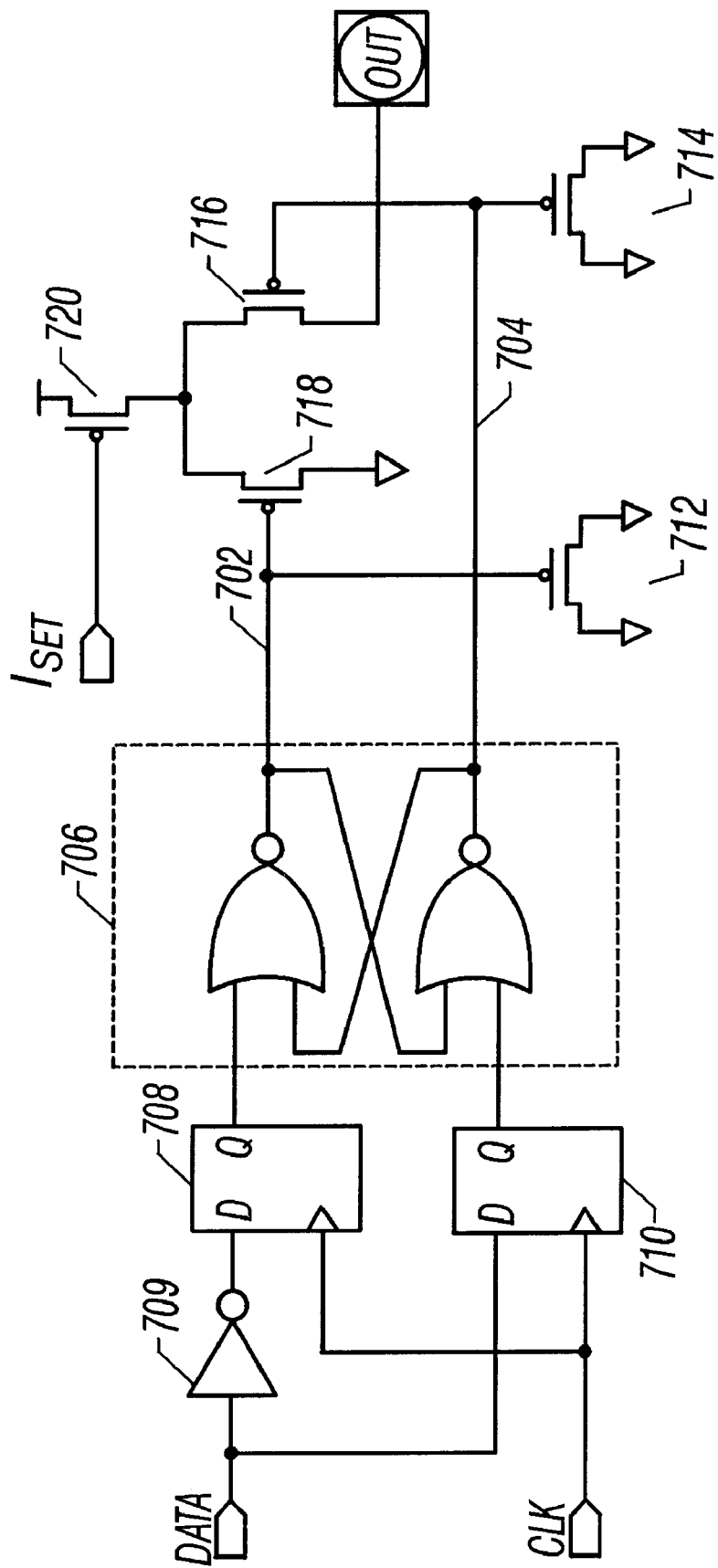
FIG. 7 is a schematic diagram of a DAC having an improved switch control signal generator circuit in accordance with the present invention.

FIG. 7 is a circuit level schematic of the illustrative embodiment shown in FIG. 6(a). Here, PFET 720 corresponds to current source 602, PFETs 716, 718 correspond to current switch 604, S-R flip-flop (SRFF) 706 corresponds to cross-over control 606, and inverter 709, DFF 708 and DFF 710 together correspond to differential synchronized signal generator 608.

The voltage at which switch control signals 702 and 704 cross, is determined by SRFF 706, which in the illustrative embodiment is implemented as a pair of cross-coupled NOR gates. In this configuration, each of the cross-coupled NOR gates generates one of the switch control signals. Cross-coupling in this manner provides feedback of each switch signal to the NOR gate that generates the other switch signal. The cross-coupling of each NOR gate output terminal to one input terminal of the other NOR gate results in a circuit configuration wherein the two NOR gate output signals become non-overlapping because logically all the inputs to a NOR gate must be low before that NOR gate output can go high. Those skilled in the art, having the benefit of this disclosure, will recognize that by selecting the physical dimensions of the transistors that implement the NOR gates, or by introducing delay in the cross-over paths, the range of voltages where the two NOR gate outputs cross can be adjusted.

As shown in FIG. 7, SRFF 706 receives input signals from a DFF 708 and a DFF 710. Each of DFFs 708, 710 are driven by the same clock, thereby making the delay of switch control signals 702 and 704 from that clock, substantially the same. Two DFFs are used in this embodiment because a single DFF with complementary outputs does not provide uniform timing to its outputs. A DFF with complimentary outputs has at least one inverter delay between its outputs.

Still referring to the illustrative embodiment shown in FIG. 7, the outputs of SRFF 706 are loaded with dummy PFETs 712 and 714. PFETs 712 and 714 are coupled respectively between node 702 and ground, and between node 704 and ground. PFETs 712 and 714 are sized to make the load on the switch control signal drivers substantially the same in each D/A stage of a DAC.

For a given channel length, the widths of PFETs 716 and 718 are proportional to the current through them. As described above, transistor size of the current switches in each of the binarily weighted stages is different. Therefore dummy PFETs 712 and 714 are sized in a complementary fashion in each of the binarily weighted current switches. In other words, the loading seen by the SRFF in each binarily weighted D/A stage of the DAC should be substantially the same. In this way, the delay from a common clock, of the switch control signals (i.e., the SRFF output signals) will be substantially the same.

Linear current switches do not require dummy transistors for load matching because they already have the largest size of current switch transistors and consequently have the most heavily loaded switch drivers.

Figure 8:
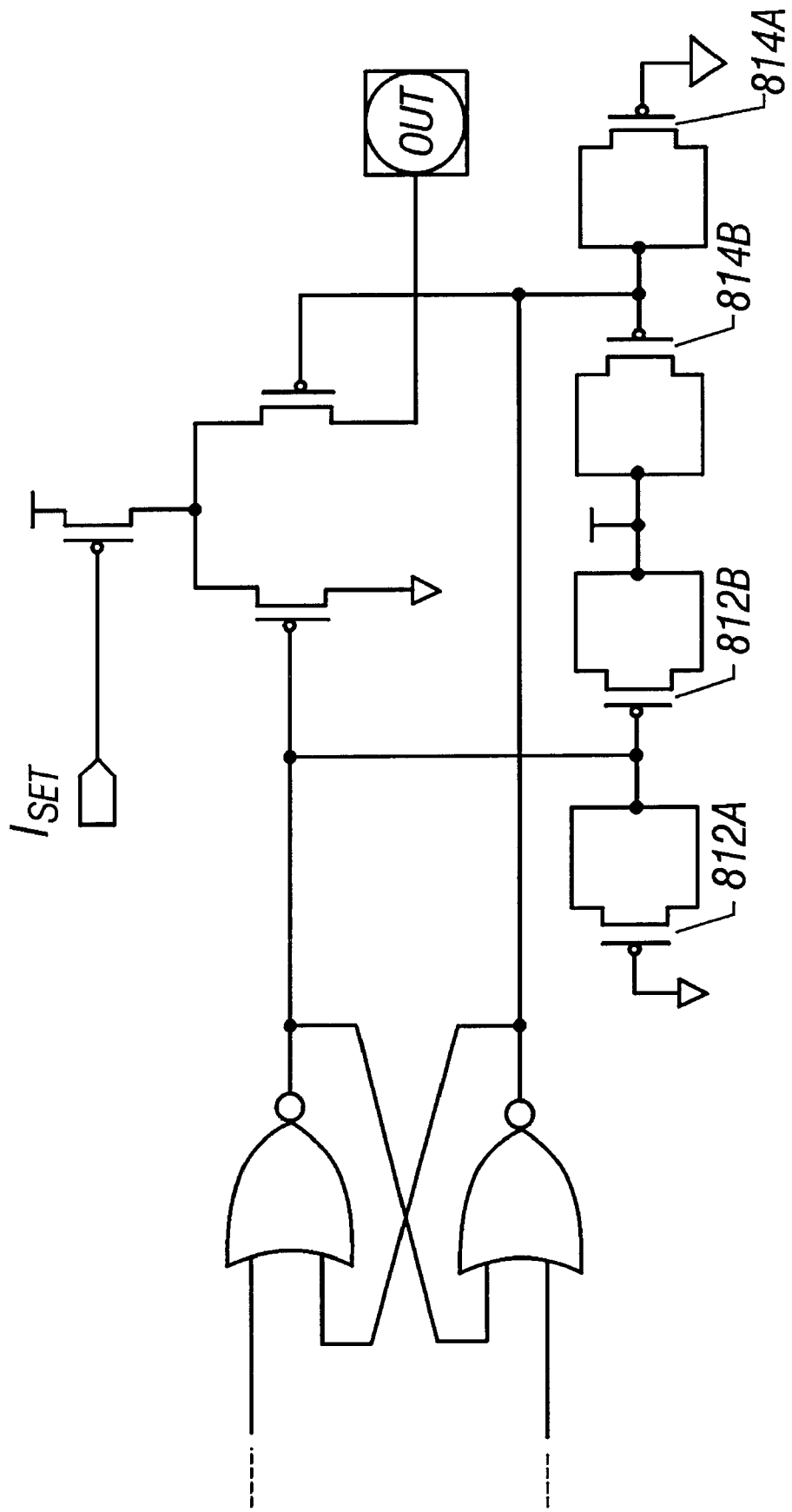
FIG. 8 is a schematic diagram of a DAC having an improved switch control signal generator circuit and alternative loading configuration in accordance with the present invention.

The connection of PFETs 712 and 714 as shown in FIG. 7, closely approximates, but does not exactly match, the capacitive loading attributable to the other current switches. However, using the same types of transistors for switch and dummy load gives very good load matching over process, environmental, and other variations. Other transistor connections can be used to better model the voltage dependence of the current switch. An example is shown in FIG. 8, wherein the dummy transistors are split such that approximately half the capacitance is to ground and approximately half is to the power supply node.

The differences in timing between the various D/A stages of the DAC may be further reduced by heavily loading the output nodes of SRFF 706 in each of the D/A stages. This heavy loading is referred to as overloading, and can be achieved by coupling additional capacitance, typically implemented as FET gate capacitance, to the output nodes as described above. The loading on each of the output nodes of SRFF 706 should be substantially equal.

Overloading has the effect of reducing timing skew attributable to variances in the inherent loading of the current switches themselves. In other words, the load that the current drivers present to the overloaded output nodes of SRFF 706 are small by comparison and therefore do not contribute appreciably to timing skew between the various D/A stages of the DAC.

Furthermore, overloading has the effect of slowing the signal transitions at the output nodes of SRFF 706, thereby reducing the impact of noise injection as measured by the rise and fall times of the DAC output.

Figure 9:
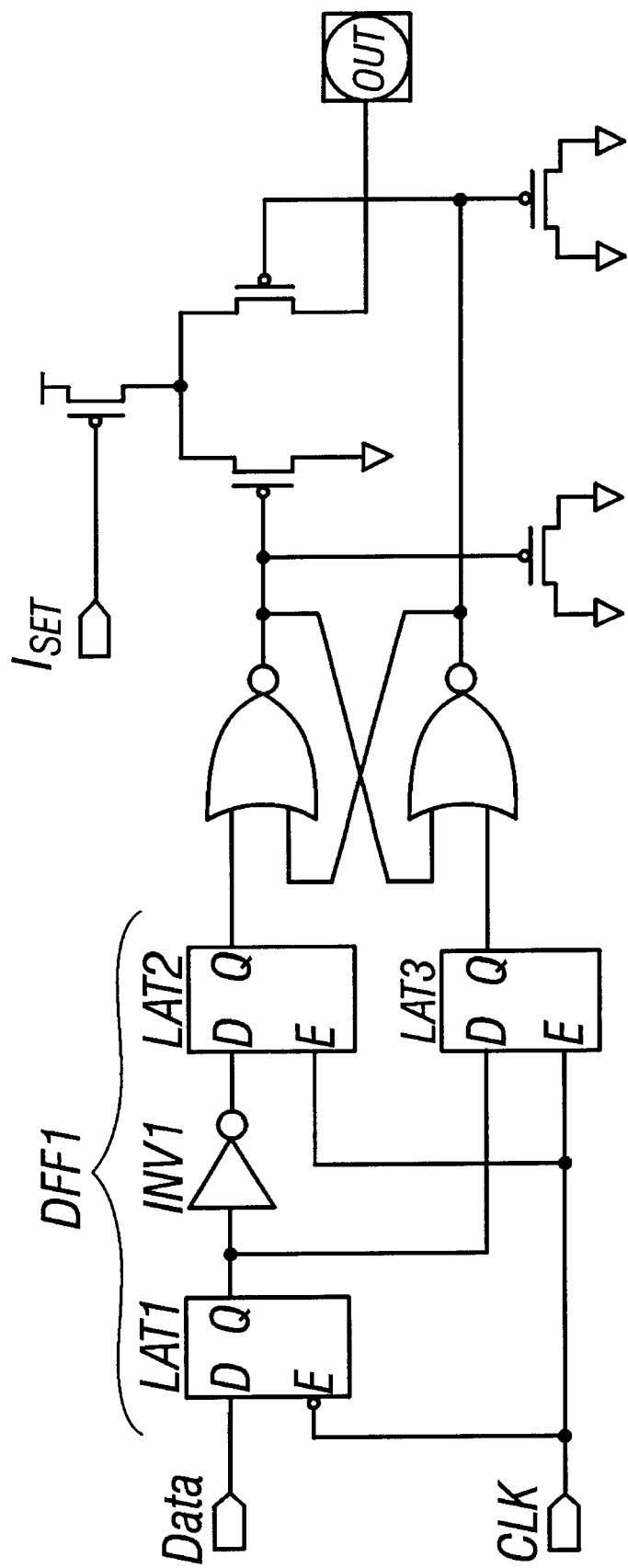
FIG. 9 is a schematic diagram of a DAC having an improved switch control signal generator circuit and alternative flip-flop arrangement in accordance with the present invention.

FIG. 9 shows an alternative embodiment of the present invention that requires less chip area to implement than the embodiment shown in FIG. 7. The embodiment shown in FIG. 7 uses two DFFs. However, by decomposing the two DFFs into their component latches, it will be seen that the redundant master latch can be removed, and an inverter moved between the latches. This configuration reduces loading on the input data line as well as reduces the chip area required for implementation.

Figure 10:
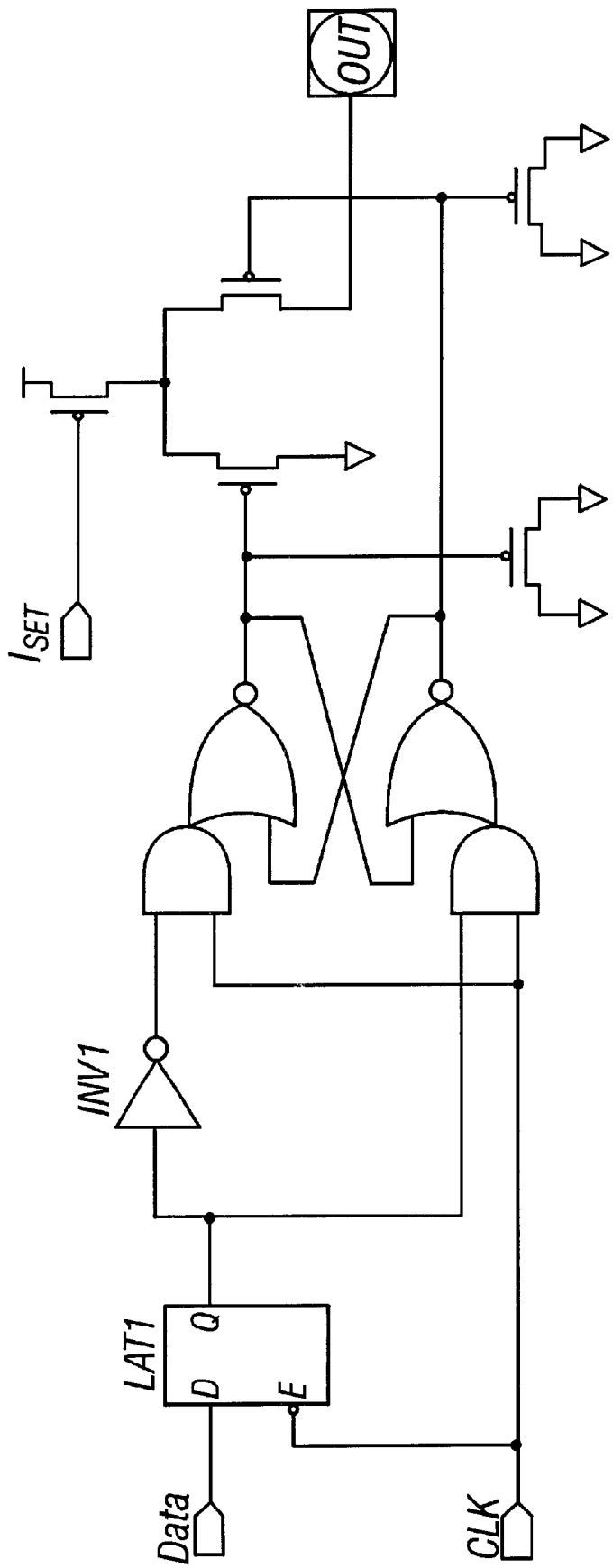
FIG. 10 is a schematic diagram of another embodiment of a DAC having improved switch control signal generator circuit in accordance with the present invention.

FIG. 10 shows another alternative embodiment of the present invention. Here, the second level of latches and the switch control signal generator SRFF can be combined. This is accomplished by substituting complex AND/NOR gates for the simpler NOR gates shown in FIGS. 7–9, and gating the data inputs with the clock signal.

Regardless of the implementation chosen, care should be taken in laying out the current switch control signal generator such that the routing of signal paths between the data flip-flops and switch control signal generator and between switch control signal generator and current switches is substantially regular and identical, including parasitic coupling to other interconnect layers and the substrate.

Conclusion

The present invention provides a method and apparatus for reducing glitch energy in the output of digital to analog converters.

An advantage of embodiments of the present invention is reduced sparkle when used in video or graphics applications.

The present invention may be implemented with various changes and substitutions to the illustrated embodiments. For example, the present invention may be implemented in processes using silicon on insulating substrates in addition to bulk silicon processes. Additionally, illustrative embodiments use field effect transistors for capacitive load matching, however, other circuit configurations with voltage-invariant capacitors may also be used.

It will be readily understood by those skilled in the art that various other changes in the details, materials, and arrangements of the parts and steps which have been described and illustrated in order to explain the nature of this invention may be made without departing from the principles and scope of the invention as expressed in the subjoined Claims.

What is claimed is:

1. An apparatus comprising:
   a current source;
   a current switch to route current from the current source to an output node; and
   an RS-type flip-flop to receive a pair of generally complementary input signals, to output a pair of generally complementary control signals to the current switch, and to control a cross-over voltage level, at which the control signals cross during a transition between voltage levels.

2. The apparatus of claim 1, wherein the current source comprises at least one field effect transistor.

3. The apparatus of claim 1, wherein the current source comprises at least one p-type field effect transistor.

4. The apparatus of claim 1, wherein the current switch comprises:
- a first field effect transistor coupled between the current source and the output node; and
- a second field effect transistor coupled between the current source and a current sink.

5. The apparatus of claim 4, wherein the first field effect transistor is a p-type field effect transistor and the second field effect transistor is a p-type field effect transistor.

6. The apparatus of claim 4, wherein the current sink is ground.

7. The apparatus of claim 4, wherein the cross-over voltage level is approximately equal to $(V_{GS}-V_T)/2$, wherein:
- $V_{GS}$ is the gate to source voltage to switch current from the current source through each field effect transistor; and
- $V_T$ is the threshold voltage of each field effect transistor.

8. The apparatus of claim 4, comprising a third field effect transistor having a gate coupled to a first control input of the current switch and a fourth field effect transistor having a gate coupled to a second control input of the current switch, wherein the source and drain of the third and fourth field effect transistors are coupled to the current sink.

9. The apparatus of claim 8, wherein the first, second, third and fourth field effect transistors are each of the same type of field effect transistor.

10. The apparatus of claim 4, comprising a third, fourth, fifth and sixth field effect transistor, wherein:
- the source and drain of the third field effect transistor and the gate of the fourth field effect transistor are coupled to a first control input of the current switch;
- the gate of the third field effect transistor is coupled to the current sink;
- the source and drain of the fourth field effect transistor are coupled to a power supply node;
- the gate of the fifth field effect transistor and the source and drain of the sixth field effect transistor are coupled to a second control input of the current switch;
- the source and drain of the fifth field effect transistor are coupled to a power supply node; and
- the gate of the sixth field effect transistor is coupled to the current sink.

11. The apparatus of claim 10, wherein the first, second, third, fourth, fifth and sixth field effect transistors are each of the same type of field effect transistor.

12. The apparatus of claim 1, wherein the RS-type flip-flop comprises a pair of cross-coupled NOR gates.

13. The apparatus of claim 12, wherein the current switch comprises:
- a first field effect transistor coupled between the current source and the output node; and
- a second field effect transistor coupled between the current source and a current sink.

14. The apparatus of claim 1, comprising:
- a circuit to generate the pair of generally complementary input signals as a function of a data signal, synchronized to a clock signal.

15. The apparatus of claim 14, wherein the circuit comprises:
- a first D-type flip-flop and a second D-type flip-flop, each having a clock input to receive the clock signal.

16. The apparatus of claim 15, wherein the first D-type flip-flop has a data input to receive the data signal.

17. The apparatus of claim 14, wherein the circuit comprises:
- a first latch having a data input to receive the data signal, an enable input to receive the clock signal, and an output;
- an inverter having an input coupled to the output of the first latch, and an output;
- a second latch having a data input coupled to the output of the inverter, an enable input to receive the clock signal, and an output coupled to a first input of the RS-type flip-flop; and
- a third latch having a data input coupled to the output of the first latch, an enable input to receive the clock signal, and an output coupled to a second input of the RS-type flip-flop.

18. The apparatus of claim 14, wherein the circuit comprises:
- a latch having a data input to receive the data signal and an enable input to receive the clock signal, and an output;
- an inverter having an input coupled to the output of the latch, and an output;
- a first AND gate having a first input coupled to the output of the inverter, a second input to receive the clock signal, and an output coupled to a first input of the RS-type flip-flop; and
- a second AND gate having a first input coupled to the output of the latch, a second input to receive the clock signal, and an output coupled to a second input of the RS-type flip-flop.

* * * * *

UNITED STATES PATENT AND TRADEMARK OFFICE
CERTIFICATE OF CORRECTION

PATENT NO. : 6,392,573 B1
DATED : May 21, 2002
INVENTOR(S) : Volk

It is certified that error appears in the above-identified patent and that said Letters Patent is hereby corrected as shown below:

<u>Column 5,</u>
Line 57, delete "suicides", insert -- silicides --.

Signed and Sealed this

Fifth Day of November, 2002

Attest:

Attesting Officer

JAMES E. ROGAN
*Director of the United States Patent and Trademark Office*